United States Patent
Yamada

(12) 
(10) Patent No.: US 6,233,170 B1
(45) Date of Patent: May 15, 2001

(54) SENSE AMPLIFIER CIRCUIT, MEMORY DEVICE USING THE CIRCUIT AND METHOD FOR READING THE MEMORY DEVICE

(75) Inventor: Junichi Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/464,448

(22) Filed: Dec. 16, 1999

(30) Foreign Application Priority Data

Dec. 24, 1998 (JP) .................................................. 10-366980

(51) Int. Cl.[7] .................................................. G11C 11/22
(52) U.S. Cl. ............................ 365/145; 365/205; 365/210
(58) Field of Search .................................... 365/145, 149, 365/190, 205, 210

(56) References Cited

U.S. PATENT DOCUMENTS

| | | | |
|---|---|---|---|
| 4,420,822 | 12/1983 | Koomen et al. | 365/182 |
| 5,455,786 | 10/1995 | Takeuchi et al. | 365/145 |
| 5,517,446 | 5/1996 | Ihara | 365/145 |
| 5,530,668 | 6/1996 | Chern et al. | 365/145 |
| 5,694,353 | * 12/1997 | Koike | 365/145 |
| 5,835,400 | * 11/1998 | Jeon et al. | 365/145 |
| 5,959,878 | * 9/1999 | Kamp | 365/117 |

FOREIGN PATENT DOCUMENTS

| | | |
|---|---|---|
| 0 720 171 A2 | 7/1996 | (EP) . |
| 0 724 265 A2 | 7/1996 | (EP) . |
| 2-110895 | 4/1990 | (JP) . |
| 6-208796 | 7/1994 | (JP) . |
| 8-8339 | 1/1996 | (JP) . |
| 8-45279 | 2/1996 | (JP) . |
| 2674775 | 7/1997 | (JP) . |
| 9-180466 | 7/1997 | (JP) . |
| 10-214488 | 8/1998 | (JP) . |

* cited by examiner

*Primary Examiner*—Son Mai
(74) *Attorney, Agent, or Firm*—Sughrue, Mion, Zinn, Macpeak & Seas, PLLC

(57) ABSTRACT

The bit lines BL1 and BL2 is precharged to a potential VCC/2, and the plate line PL1 is set to a potential VCC/2. All word lines WL1 and WL2 are set to the high potential so as to sustain the connection node of one terminal of the ferroelectric capacitance and source terminals of cell transistors TC11 and TC12 to a potential VCC/2. After that, all lines except the word line WL1 to be selected are set to the ground potential. The sense amplifier enable signal SAN is set to the ground potential so as to make NMOS transistors MN1 and MN2 in conduction. The charge in a bit line capacitance and a ferroelectric capacitance is discharged to the ground potential. In this case, a signal voltage that can be detected by the sense amplifier SA is generated on the two bit lines BL1 and BL2, so the signal voltage can be amplified by turning on PMOS transistors MP1 and MP2. Thus, a ferroelectric memory device is provided that can realize reading and writing operation by a simple control so as to improve substantially the operation speed and the power consumption.

16 Claims, 17 Drawing Sheets

SENSE AMPLIFIER CIRCUIT, MEMORY DEVICE USING THE CIRCUIT AND METHOD FOR READING THE MEMORY DEVICE

BACKGROUND OF THE INVENTION

1. Field of the Invention

The present invention relates to a sense amplifier circuit, a memory device using the circuit, and a method for reading the memory device. More specifically, the present invention relates to a method for reading a ferroelectric memory device made of a ferroelectric material.

2. Description of the Related Art

Conventionally, a ferroelectric capacitance has a hysteresis between an applied voltage and polarization. Therefore, a ferroelectric memory device can sustain data by remaining polarization even if the applied voltage becomes zero after writing data by applying a voltage to the ferroelectric capacitance. This characteristic is used for making up a nonvolatile ferroelectric memory device.

When reading data out of the nonvolatile ferroelectric memory device, a sense amplifier having a differential voltage input determines the state 0 or 1 of data memorized in the memory cell. Therefore, it is necessary to generate a voltage corresponding to the data 0 or 1 on the bit line before determining the state 0 or 1 by the sense amplifier. The bit line voltage corresponding to the voltage memorizing data can be realized by applying a voltage to the ferroelectric to read polarization charge onto the bit line.

A method for applying a voltage to such a ferroelectric is disclosed in Japanese Patent No. 2674775, U.S. Pat. No. 5,530,668, or Japanese Patent Publication Hei 8-8339.

The first prior art method disclosed in the Japanese Patent No. 2674775 will be explained with reference to FIGS. 1 to 3. In FIGS. 1 and 2, the bit lines BLa1 and BLa2 are precharged by a bit line precharge signal PBL to the ground level, and the plate line PLa1 is at the ground level.

The memory cell MCa1 is selected when the word line WLa1 becomes the high level. When the plate line PLa1 is driven to VCC, a voltage is applied to the ferroelectric CFa1, and the polarization charge is read out on the bit line BLa1. Since the bit line BLa1 has a parasitic capacitance, a bit line voltage is generated in accordance with polarization charge corresponding to the data 0 or 1 sustained in the memory cell MCa1.

FIG. 3 shows the bit line voltage when the polarization charge sustained by the memory cell MCa1 is read out on the bit line BLa1. The bit line voltage depends on the relationship between the hysteresis characteristic of the ferroelectric CFa1 and the bit line capacitance. The bit line voltage becomes V1 upon reading when the polarization of the ferroelectric CFa1 switches, while it becomes V0 when the polarization does not switch.

The sense amplifier SAa1 determines the state 0 or 1 of the read data by the dummy cell DMCa1 using a reference voltage generated on the other bit line BLa2. After that, for rewriting, the plate line PLa1 is connected to the ground potential, the sense amplifier SAa1 is changed to non-active state, the bit lines BLa1 and BLa2 are discharged to the ground level, and the word line WLa1 is connected to the ground potential so as to finish the read or write cycle.

The second prior art method disclosed in the U.S. Pat. No. 5,530,668 will be explained with reference to FIGS. 1 and 4. In these figures, the bit lines BLa1 and BLa2 are precharged by the bit line precharge signal PBL to 5 volts, and the plate line PLa1 is connected to the ground potential.

The memory cell MCa1 is selected when the word line WLa1 becomes the high potential level. Since the bit line BLa1 is precharged to 5 volts, when the word line WLa1 becomes high level and the cell transistor TCa1 becomes conduction, a voltage is applied to the ferroelectric CFa1 without driving the plate line PLa1, and the bit line voltage is generated. After that, the sense amplifier SAa1 determines 0 or 1 state. In addition, the plate line PLa1 is driven for rewriting. The plate line PLa1 is driven only for rewriting, so that an access speed can be improved.

Furthermore, the third prior art method disclosed in Japanese Patent Publication Hei 8-8339 will be explained with reference to FIG. 5. In this figure, the plate line PLa1 is fixed to the potential VCC/2. In addition, the bit lines BLa1 and BLa2 are precharged to VCC/2 during waiting period, and precharged to the ground level or VCC before the memory cell MCa1 is selected. Therefore, when the word line WLa1 selects the memory cell MCa1 and the cell transistor TCa1 becomes conduction, a voltage is applied to the ferroelectric FCa1 without driving the plate line PLa1, so that the bit line voltage is generated.

After that, the sense amplifier SAa1 determines the 0 or 1 state and performs rewriting. Since the voltage of the plate line PLa1 is VCC/2, the rewriting is finished without driving the plate line PLa1. In addition, since a potential of a cell node NCa1 is sustained at VCC/2 during the waiting period, all word lines are set to the high levels so that the potential of the cell node NCa1 is secured. Thus, refreshing operation is not required.

In FIG. 1, DPLa1 denotes a dummy plate line, DFCa1 denotes a dummy ferroelectric, DTCa1 denotes a dummy cell transistor, and DNCa1 denotes a dummy cell node.

The conventional nonvolatile ferroelectric memory device explained above has a problem in the method for applying a voltage to the ferroelectric. Namely, in the first prior art method where the plate line is driven, the access time is lengthened. This problem is caused by a large time constant of the plate line that makes the driving time long for obtaining a sufficient level of the signal voltage.

In addition, in the second prior art method where the plate line is not driven, power consumption during waiting period increases. This problem is caused by that a leak current should be compensated for securing the bit line voltage at 5 volts during waiting period.

Furthermore, in the third prior art method where the plate line is not driven, the control becomes complicated, the power consumption increases and the access time is lengthened. In the third method, the potential of the plate line is fixed to VCC/2, the refreshing operation is not required. Therefore, the bit line potential during waiting period is set to VCC/2 that is the same as the plate line potential, and all word lines are set to the high level so as to make the cell transistor conduction.

However, just before memory access operation, it is necessary to set all word lines to the ground potential and to precharge the bit line to the ground potential or VCC, so as to reset only the selected word line to the high level. Therefore, the control of the word line and the control of the bit line precharge become complicated. In addition, the access time is lengthened and power consumption is increased since the word line and the bit line are driven many times.

SUMMARY OF THE INVENTION

In order to an solve the above-mentioned problems, an object of the present invention is to provide a sense amplifier circuit that can realize reading and writing operation by a simple control and can substantially improve the operation speed as well as the power consumption, a memory device using the circuit and a method for reading the memory device.

A sense amplifier circuit according to the present invention is connected to two bit lines of a memory cell array including a plurality of memory cells disposed in rows and columns for memorizing information, a plurality of bit lines disposed corresponding to the columns of the plurality of memory cells, and a plate line connected to the plurality of memory cells. The sense amplifier circuit is activated in the state where the plate line is not driven and the potential levels of the plate line and the bit lines are identical to each other upon reading.

A memory device according to the present invention comprises a memory cell array including a plurality of memory cells disposed in rows and columns for memorizing information, a plurality of bit lines disposed corresponding to the columns of the plurality of memory cells, and a plate line connected to the plurality of memory cells; and a plurality of differential type sense amplifiers connected to two bit lines.

The differential type sense amplifier is activated in the state where the plate line is not driven and the potential levels of the plate line and the bit lines are identical to each other so as to read data out of the memory cell upon reading.

A method for reading data out of a memory device according to the present invention is applied to a memory device that comprises a memory cell array including a plurality of memory cells disposed in rows and columns for memorizing information, a plurality of bit lines disposed corresponding to the columns of the plurality of memory cells, and a plate line connected to the plurality of memory cells; and a plurality of differential type sense amplifiers connected to two bit lines. The method comprises the step of activating the differential type sense amplifier in the state where the plate line is not driven and the potential levels of the plate line and the bit lines are identical to each other so as to read data out of the memory cell upon reading.

Namely, the memory device according to the present invention, in order to achieve the above-mentioned object, is structured so that the sense amplifier can read the data out of the memory cell even if there is no signal voltage on the bit line. Accordingly, it is not required to apply a voltage to the ferroelectric in advance by driving the plate line or by precharging the bit line.

Therefore, the memory device according to the present invention can reduce charging and discharging power as well as charging and discharging time according to the bit line in the conventional method. Thus, a ferroelectric memory device with high speed and low consumption power can be realized by the simple control. Namely, according to the present invention, the effect can be obtained that reading and writing operations can be performed by the simple control and the operation speed as well as the power consumption is improved substantially.

DETAILED DESCRIPTION OF THE PREFERRED EMBODIMENTS

Figure 1:
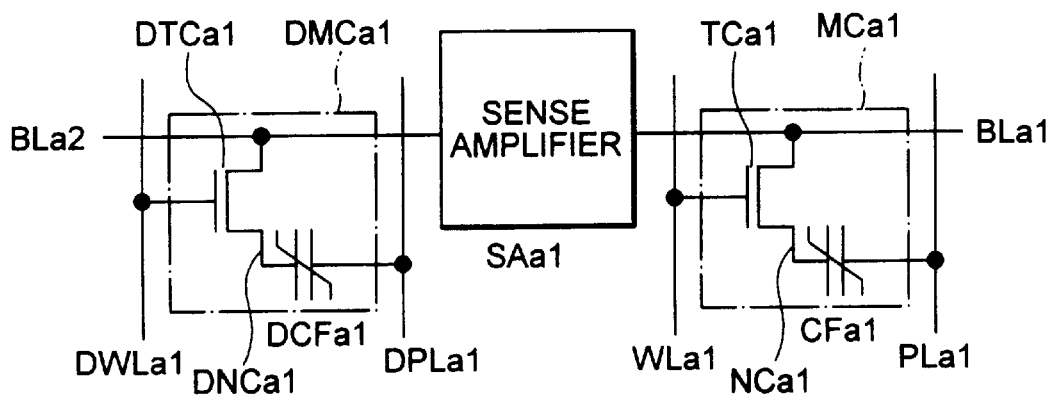
FIG. 1 is a circuit diagram for explaining the reading operation of the conventional ferroelectric memory device.
Figure 2:
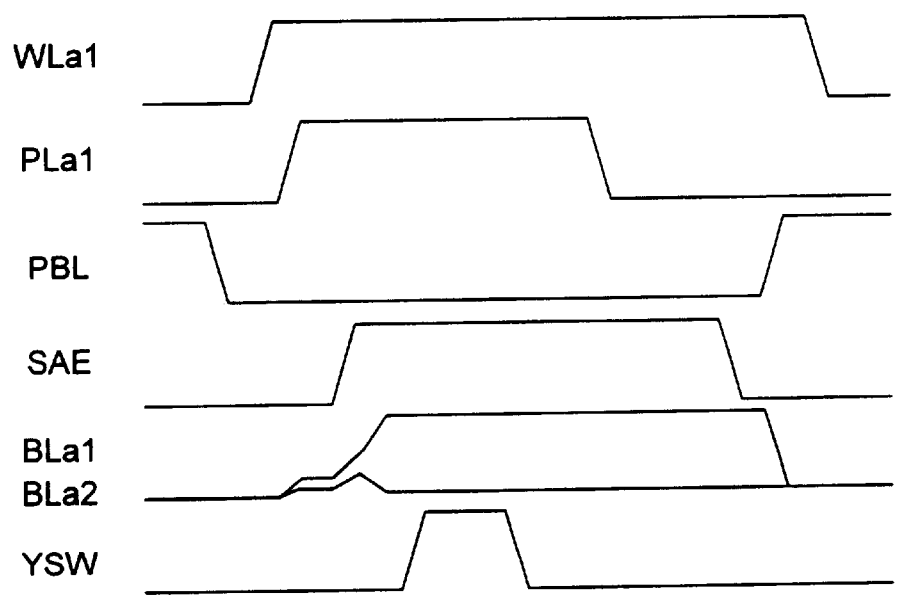
FIG. 2 is a timing chart of the control signal for explaining the conventional reading operation.
Figure 3:
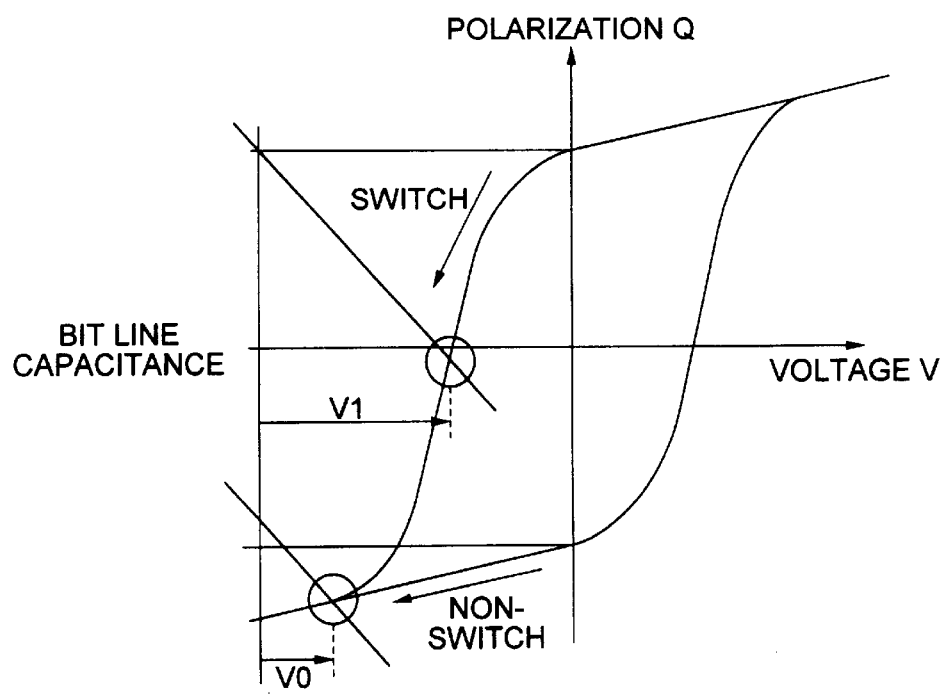
FIG. 3 is a diagram for explaining the conventional reading operation.
Figure 4:
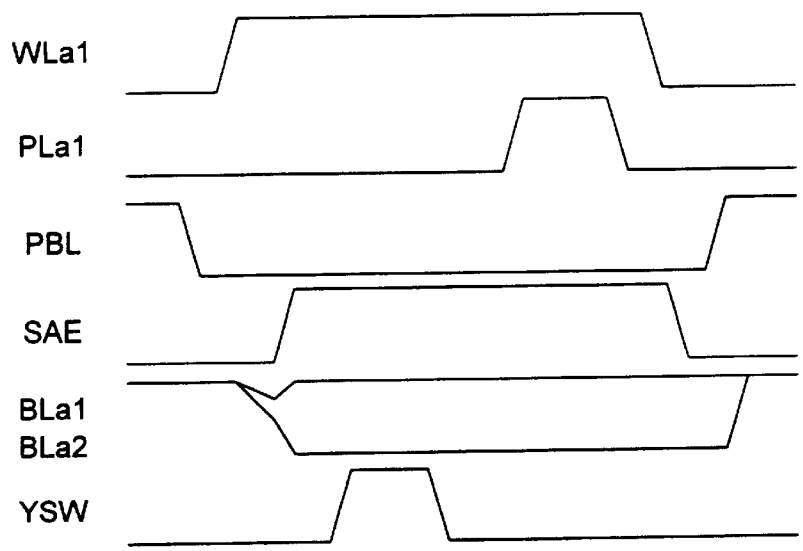
FIG. 4 is a timing chart of the control signal for explaining the conventional reading operation.
Figure 5:
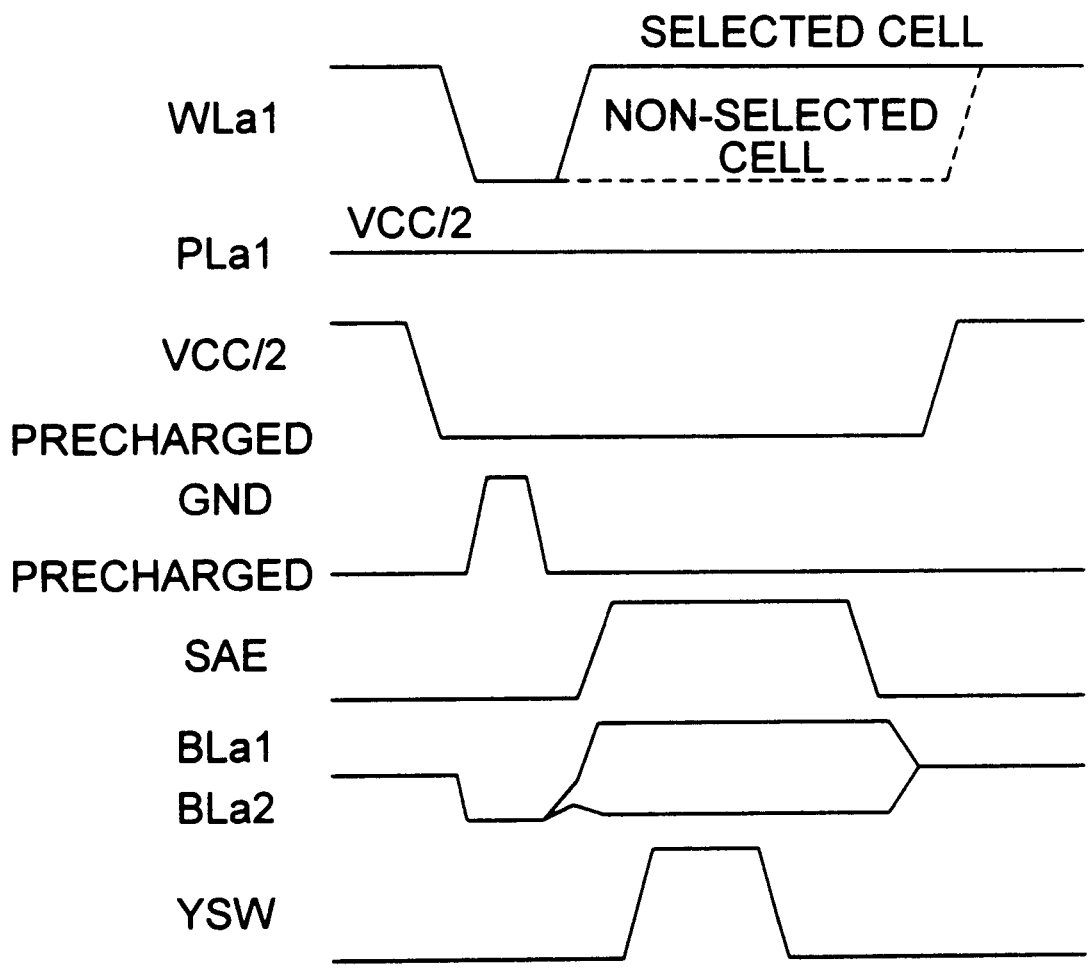
FIG. 5 is a timing chart of the control signal for explaining the conventional reading operation.
Figure 6:
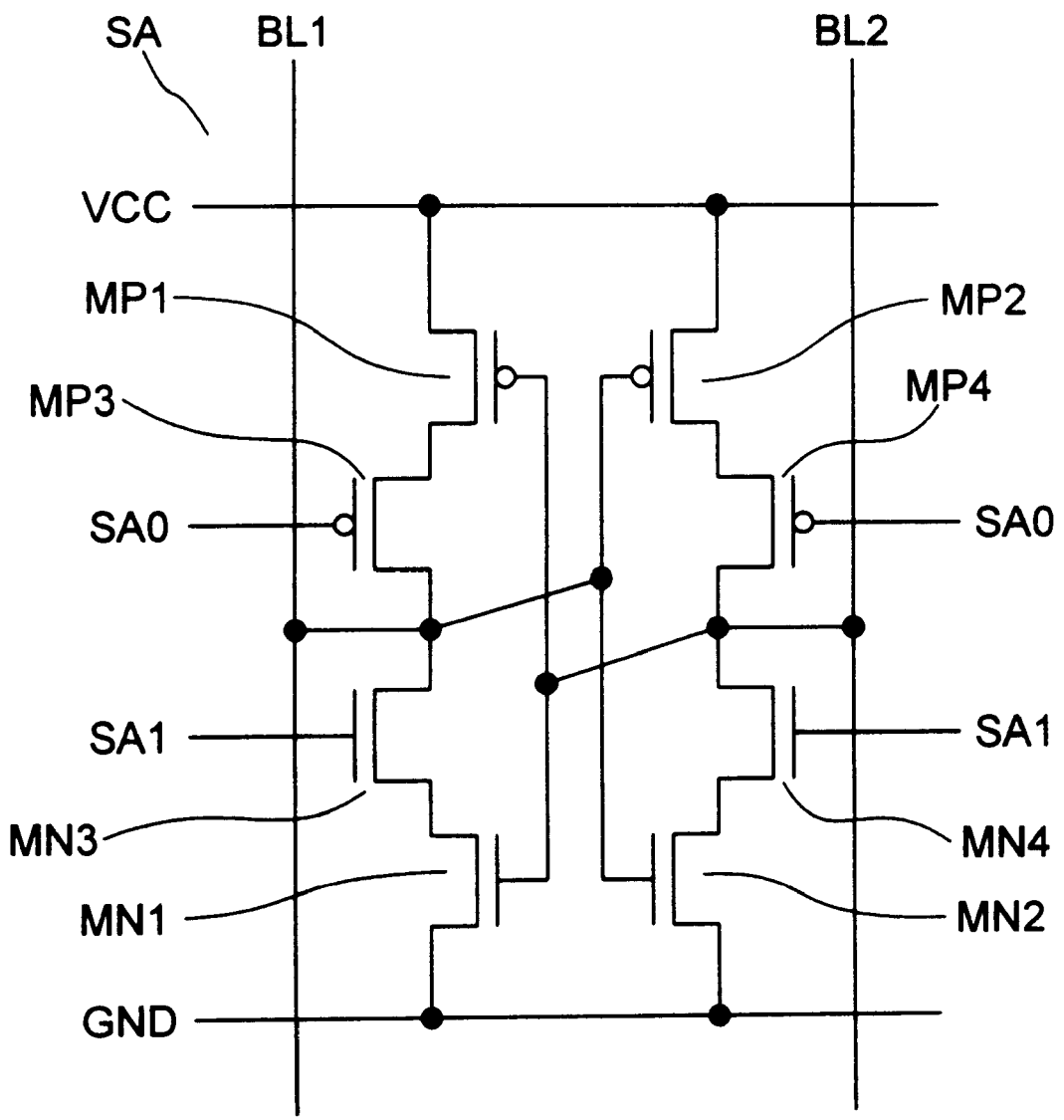
FIG. 6 shows a circuit of a sense amplifier used for the present invention.

Hereinafter, the present invention will be described in detail by the examples with reference to the accompanying drawings. FIG. 6 is a schematic showing a circuit of a sense amplifier used for the first example of the present invention. In FIG. 6, the sense amplifier SA includes PMOS transistors MP1, MP2, MP3 and MP4, and NMOS transistors MN1, MN2, MN3 and MN4. The sense amplifier SA detects data utilizing a differential capacitance between the bit lines BL1 and BL2. The sense amplifier SA sets the sense amplifier control signal SA0 to VCC level and sets the sense amplifier control signal SA1 to the GND level in the non-activated state. When activating this sense amplifier SA, the sense amplifier control signal SA0 is set to the GND level first, or the sense amplifier control signal SA1 is set to the VCC level, so that the PMOS transistors MP3 and MP4 or NMOS transistors MN3 and MN4 are made conduction.

The sense amplifier SA works completely when the other sense amplifier control signal SA1 or the sense amplifier control signal SA0 is supplied after the time for generating 100 mV as a signal voltage on the bit line (i.e., less than 10 ns). On the contrary, transition of the sense amplifier SA from the active state to the nonactive state is performed by resetting the sense amplifier control signal SA0 to the VCC level, and by resetting the sense amplifier control signal SA1 to the GND level.

Figure 7:
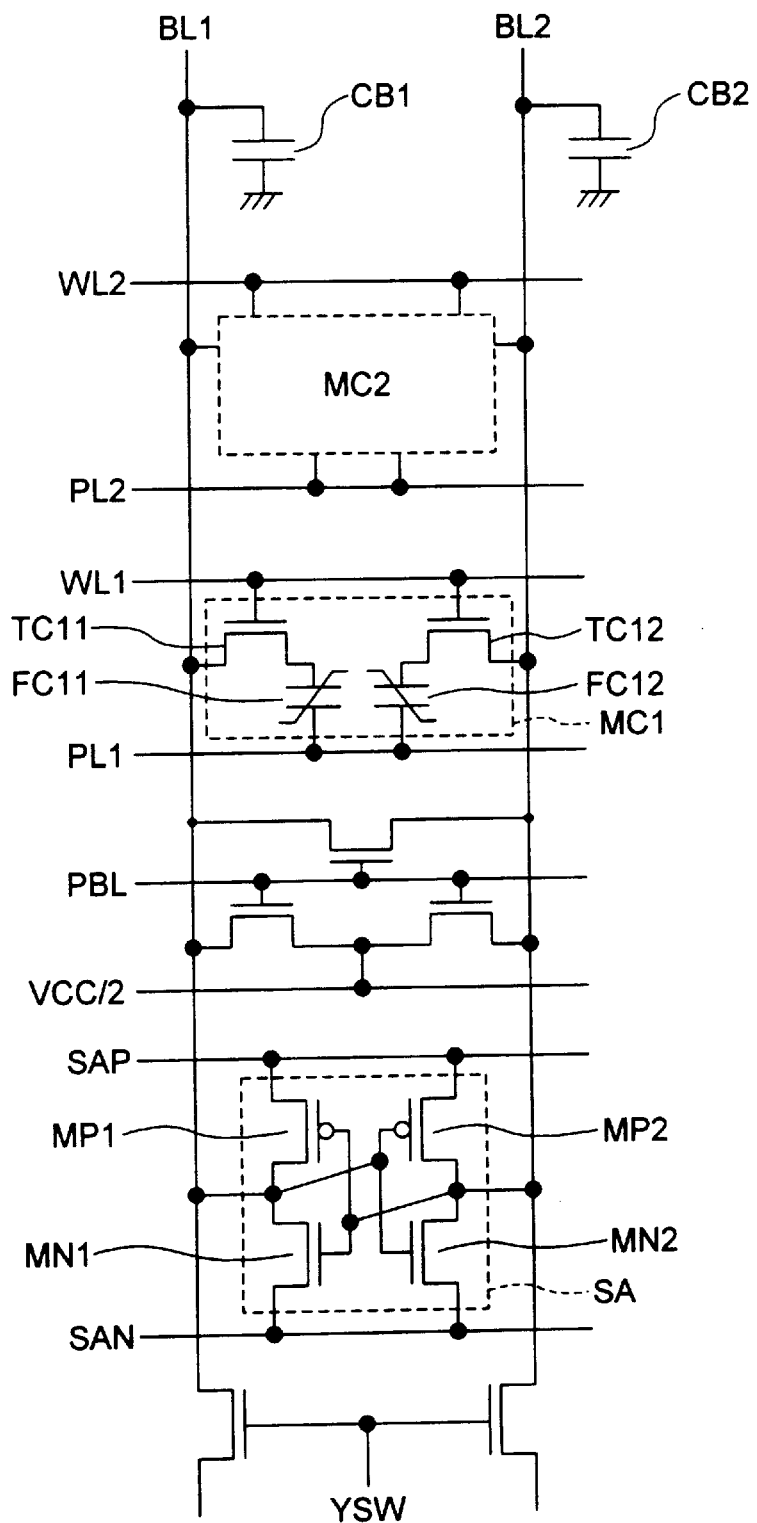
FIG. 7 shows a circuit configuration of the ferroelectric memory device according to a first example of the present invention.

FIG. 7 shows a circuit of the ferroelectric memory device according to the first example of the present invention. In this figure, two neighboring bit lines BL1 and BL2 of the ferroelectric memory device according to the first example of the present invention have parasitic capacitance CB1, CB2, one end of which is connected to the sense amplifier SA that detects data utilizing the differential capacitance between the bit lines BL1 and BL2. The sense amplifier SA used in the present invention can be also used for the other than the ferroelectric memory device explained below.

The memory cell MC1 includes two ferroelectric capacitors FC11 and FC12 and two cell transistors TC11 and TC12. One terminal of each ferroelectric capacitor FC11, FC12 is connected to the plate line PL1, and the other terminal of the ferroelectric capacitor FC11 is connected to the source terminal of the cell transistor TC11. The other terminal of the ferroelectric capacitor FC12 is connected to the source terminal of the cell transistor TC12.

The gate terminal of each cell transistor TC11 or TC12 is connected to the word line WL1, the drain terminal of the cell transistor TC11 is connected to the bit line BL1, and the drain terminal of the cell transistor TC12 is connected to the bit line BL2. The memory cell MC2 has a circuit configuration similar to that of the memory cell MC1. The structure and the element size are also similar to those of the memory cell MC1.

Reference WL2 denotes a word line, reference PL2 denotes a plate line, reference PBL denotes a bit line precharge signal, references SAP and SAN denote sense amplifier enable signals, references MP1 and MP2 denote PMOS transistors, references MN1 and MN2 denote NMOS transistors, and reference YSW denotes a Y direction selection signal. Inputting the above-mentioned Y direction selection signal YSW, the memory cells in the Y direction are selected. However, the operation by the direction selection signal YSW is not directly related to the present invention, so the explanation of the operation is omitted.

Figure 8:
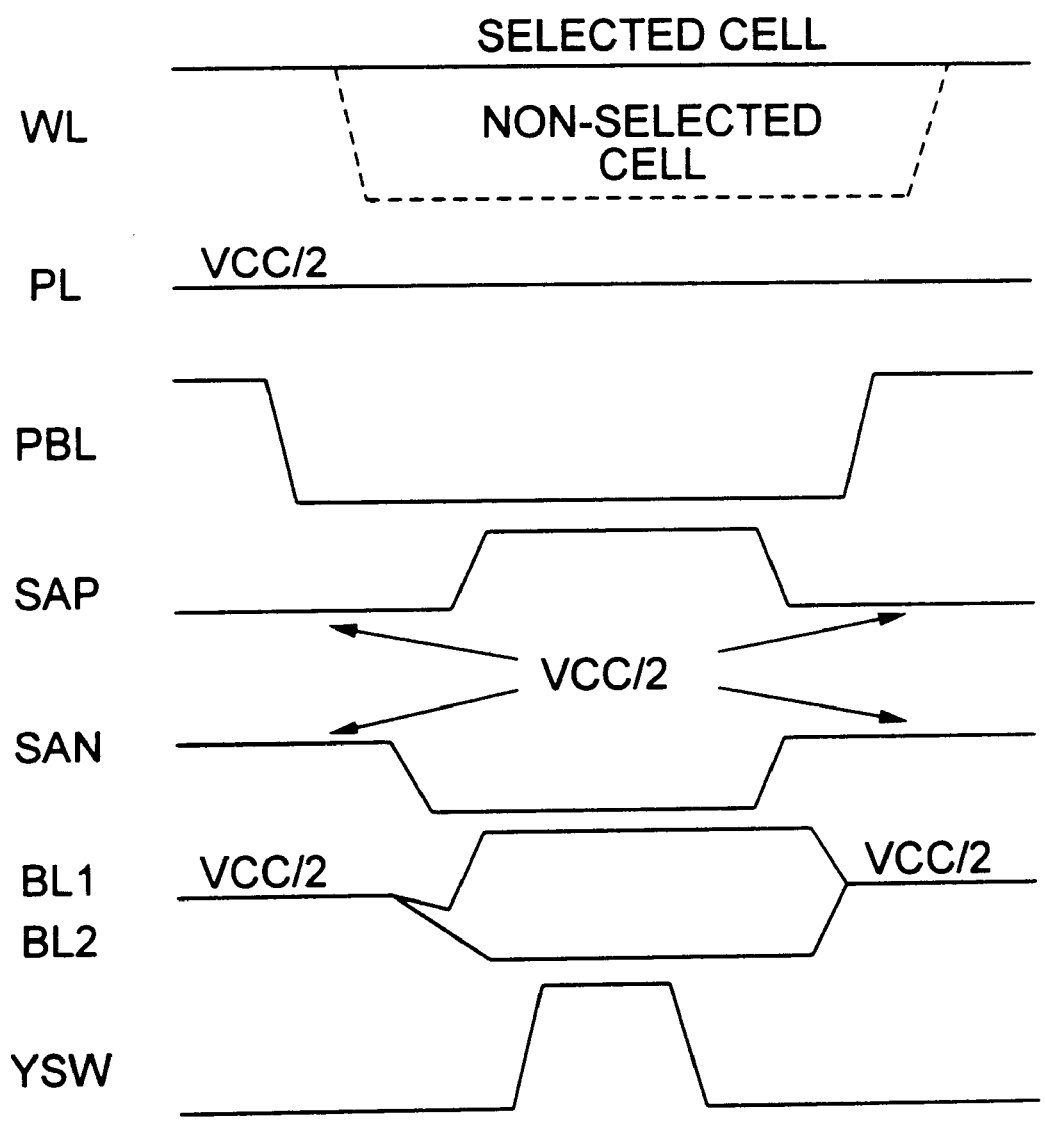
FIG. 8 is a timing chart showing the operation timing of the ferroelectric memory device according to the first example of the present invention.
Figure 9:
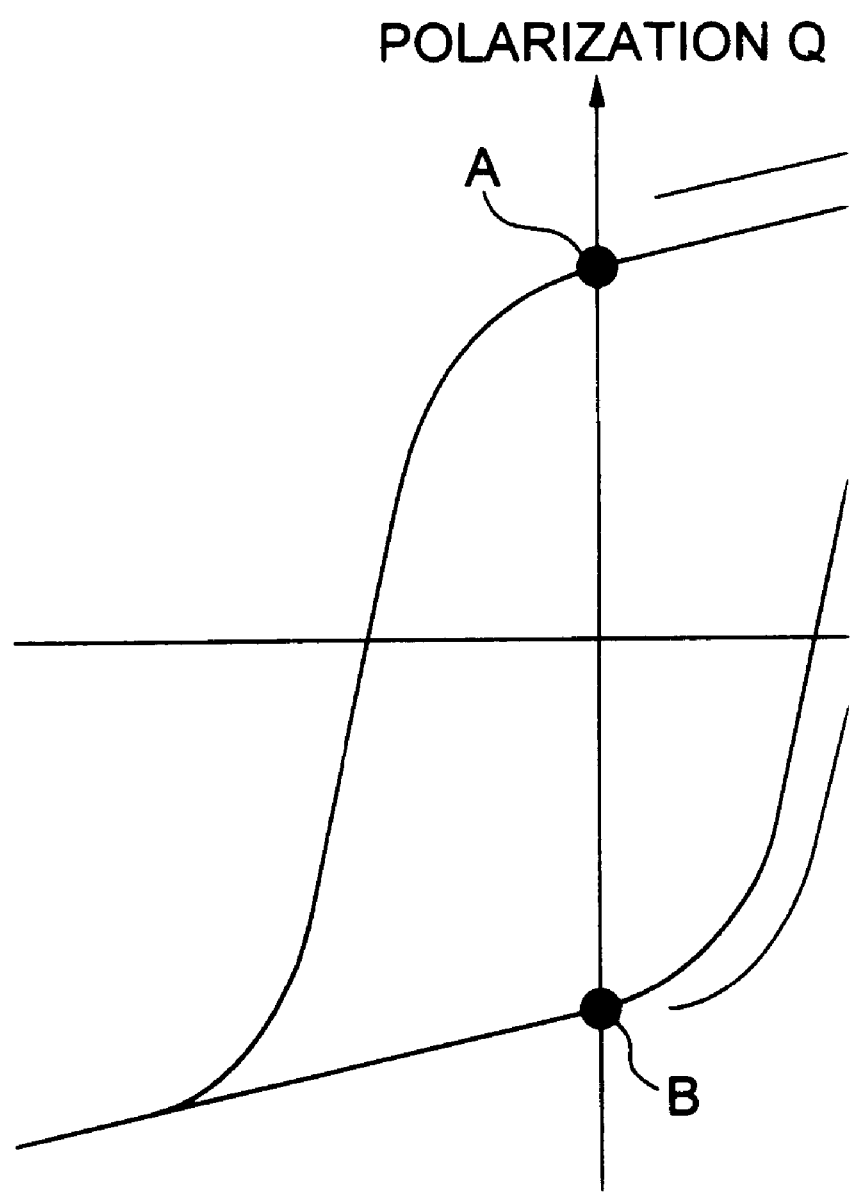
FIG. 9 is a diagram for explaining the operation of the ferroelectric memory device according to the first example of the present invention.

FIG. 8 is a timing chart showing the operation timing of the ferroelectric memory device according to the first example of the present invention. FIG. 9 is a diagram for explaining the operation of the ferroelectric memory device according to the first example of the present invention. The read operation of the ferroelectric memory device according to the first example of the present invention will be explained with reference to FIGS. 7–9.

During waiting period, bit lines BL1 and BL2 are precharged to the level VCC/2, the plate line PL1 is set to the level VCC/2, and the connection node between one terminal of the ferroelectric capacitance and the source terminal of the cell transistor TC11 is sustained to the level VCC/2 by setting all word lines WL1 and WL2 are set to the high potential level. After that, all lines except the word line WL1 are set to the ground potential.

In this state, the sense amplifier enable signal SAN is set to the ground potential so that the NMOS transistors MN1 and MN2 are in conduction, and the charge in the bit line capacitance and the ferroelectric capacitance is discharged to the ground potential. Since the NMOS transistors MN1 and MN2 have the same size, the same current flows out of the bit lines BL1 and BL2.

In addition, the ferroelectric capacitors FC11 and FC12 have a large size in the same order as the parasitic capacitance of the bit lines BL1 and BL2. The capacitance depends on the polarization direction. The two ferroelectric capacitors of the memory cell MC1 are different from each other in the polarization direction. As shown in FIG. 8, one is in the state A and the other is in the state B. Therefore, a signal voltage is generated on the two bit lines that can be detected by the sense amplifier SA. After that, the sense amplifier enable signal SAP is set to the VCC so that the PMOS transistors MP1 and MP2 are turned on for amplifying the signal voltage.

Therefore, according to this method, it is not required to drive the plate line PL1 before the sense amplifier SA works. In addition, the control of the word lines WL1 and WL2 as well as the control of precharging the bit lines BL1 and BL2 is simplified, so that the access time is shortened.

Furthermore, when the level of the plate line PL1 is fixed to VCC/2 so that the signal voltage is amplified by the sense amplifier SA, rewriting process is performed automatically, so the cycle time is also shortened. In addition, since the level of the cell node is sustained to VCC/2 during waiting period, refreshing operation is not required.

In this case, concerning the operation method of the sense amplifier SA, timings for turning on NMOS transistors MN1, MN2 and PMOS transistors MP1, MP2 can be different, so that either the NMOS transistors MN1, MN2 or the PMOS transistors MP1, MP2 works until the signal voltage is generated and becomes stable above the operation margin of the sense amplifier SA, when the sense amplifier SA is operated completely. Thus, the sense amplifier SA is operated more securely. Though the sense amplifier used in the first example of the present invention has a different configuration from the sense amplifier shown in FIG. 6, the operation thereof is similar to that of the sense amplifier shown in FIG. 6.

Figure 10:
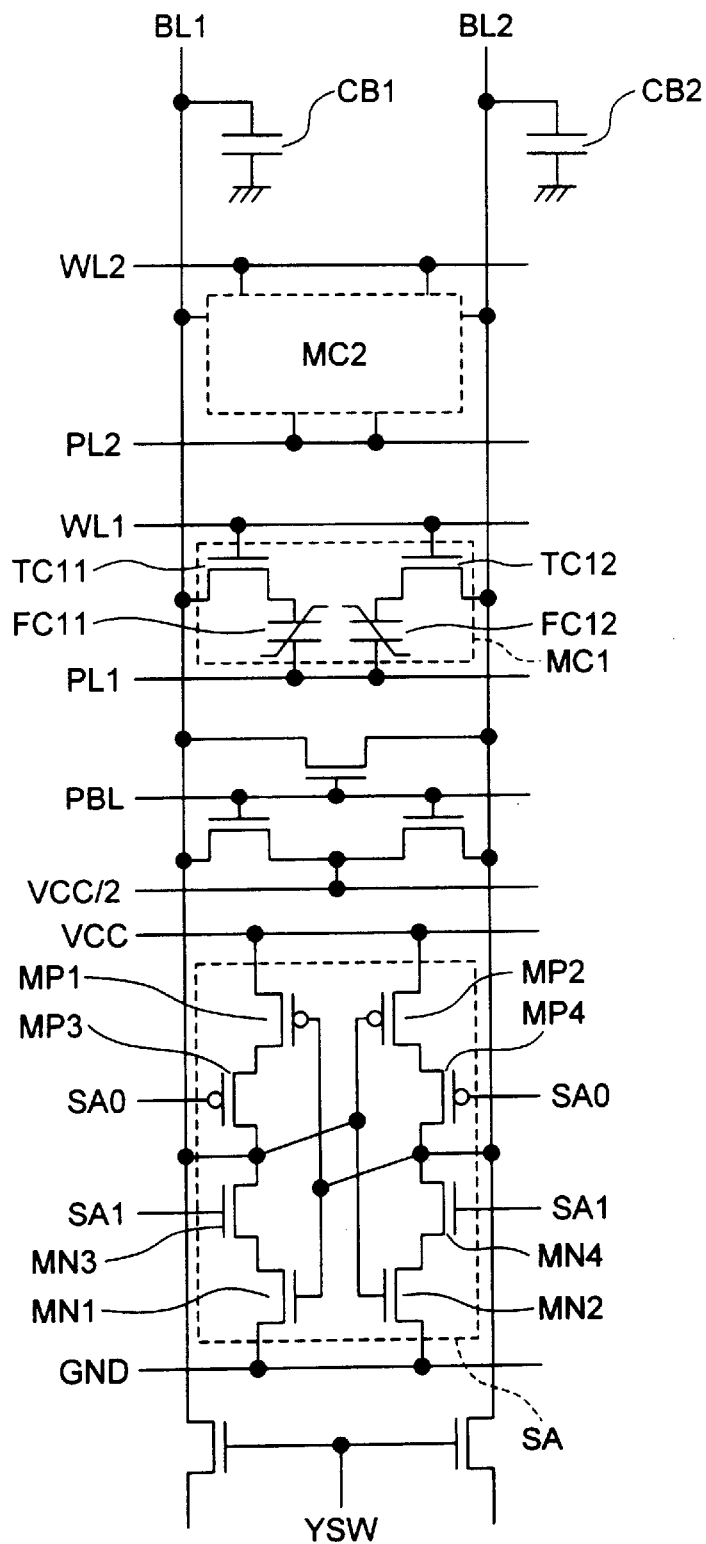
FIG. 10 shows a circuit configuration of the ferroelectric memory device according to a second example of the present invention.

FIG. 10 shows a circuit configuration of the ferroelectric memory device according to a second example of the present invention. In this figure, two neighboring bit lines BL1 and BL2 of the ferroelectric memory device according to the second example of the present invention have parasitic capacitance CB1, CB2, one end of which is connected to the sense amplifier SA that detects data utilizing the differential capacitance between the bit lines BL1 and BL2.

The memory cell MC1 includes two ferroelectric capacitors FC11 and FC12 and two cell transistors TC11 and TC12. One terminal of each ferroelectric capacitor FC11, FC12 is connected to the plate line PL1, and the other terminal of the ferroelectric capacitor FC11 is connected to the source terminal of the cell transistor TC11. The other terminal of the ferroelectric capacitor FC12 is connected to the source terminal of the cell transistor TC12.

The gate terminal of each cell transistor TC11 or TC12 is connected to the word line WL1, the drain terminal of the cell transistor TC11 is connected to the bit lineBL1, and the drain terminal of the cell transistor TC12 is connected to the bit line BL2. The memory cell MC2 has a circuit configuration similar to that of the memory cell MC1. The structure and the element size are also similar to those of the memory cell MC1.

Reference WL2 denotes a word line, reference PL2 denotes a plate line, reference PBL denotes a bit line precharge signal, references SA0 and SA1 denote sense amplifier control signals, references MP1, MP2, MP3, and MP4 denote PMOS transistors, references MN1, MN2, MN3, and MN4 denote NMOS transistors, and reference YSW denotes a Y direction selection signal. The sense amplifier used in the second example of the present invention has the same configuration and the same operation as in the sense amplifier shown in FIG. 6.

Figure 11:
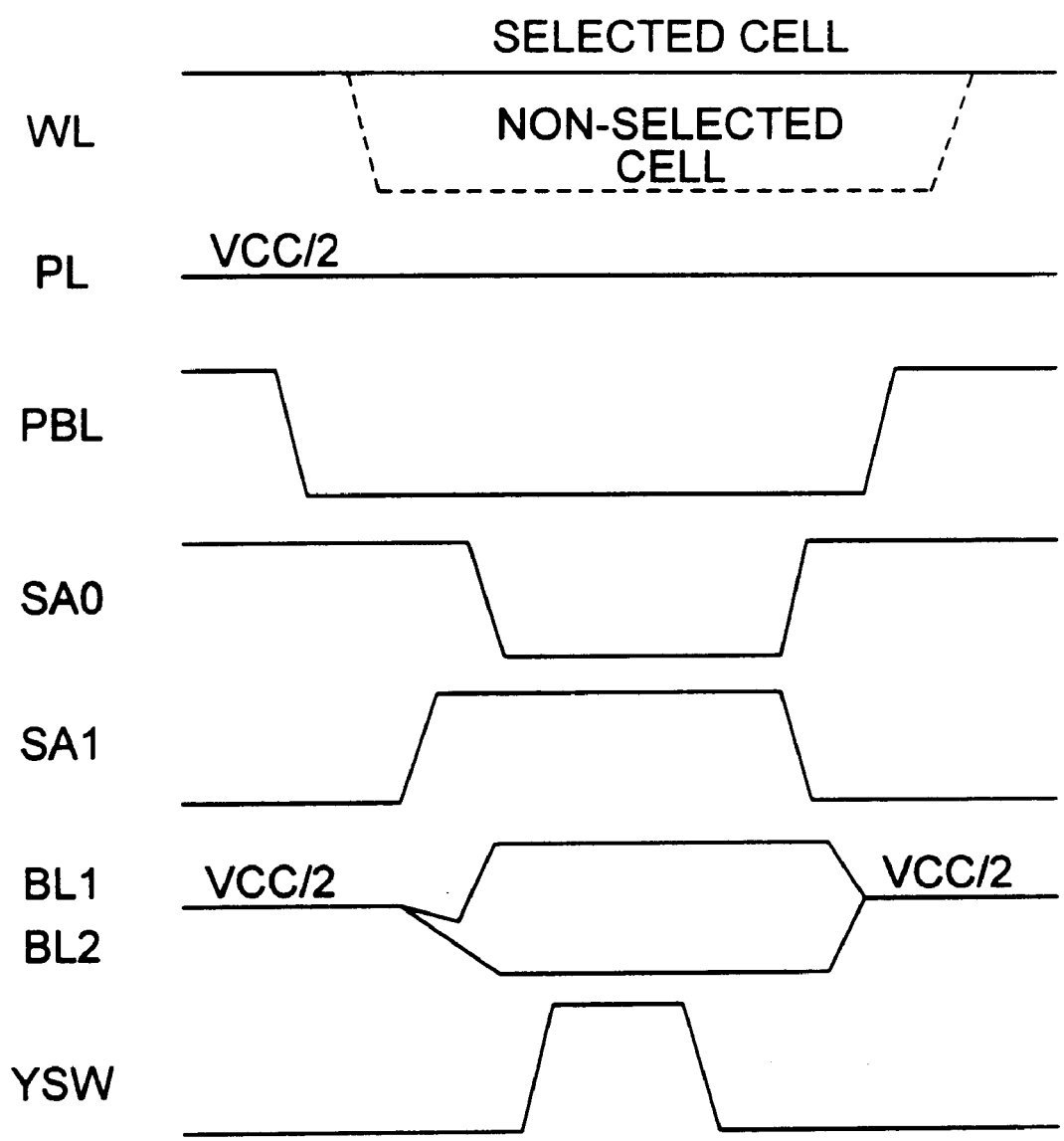
FIG. 11 is a timing chart showing the operation timing of the ferroelectric memory device according to the second example of the present invention.

FIG. 11 is a timing chart showing the operation timing of the ferroelectric memory device according to the second example of the present invention. The read operation of the ferroelectric memory device according to the second example of the present invention will be explained with reference to FIGS. 10 and 11.

During waiting period, bit lines BL1 and BL2 is precharged to the level VCC/2, the plate line PL1 is set to the level VCC/2, and the connection node between one terminal of the ferroelectric capacitance and the source terminal of the cell transistor TC11 is sustained to the level VCC/2 by setting all word lines WL1 and WL2 are set to the high potential level. After that, all lines except the word line WL1 are set to the ground potential.

In this state, the sense amplifier control signal SA1 is set to the potential VCC so that the NMOS transistors MN3 and MN4 are in conduction and the charge in the bit line capacitance and the ferroelectric capacitance is discharged to the ground potential. Since the NMOS transistors MN1, MN2, MN3 and MN4 have the same size, the same current flows out of the bit lines BL1 and BL2.

In addition, the ferroelectric capacitors FC11 and FC12 have a large size in the same order as the parasitic capacitance of the bit lines BL1 and BL2. The capacitance depends on the polarization direction. The two ferroelectric capacitors of the memory cell MC1 have polarization directions different from each other. As shown in FIG. 9, one is in the state A and the other is in the state B.

Therefore, since the current flowing out of the bit lines BL1 and BL2 is the same, a signal voltage that can be detected by the sense amplifier SA is generated on the two bit lines. After that, the sense amplifier control signal SA0 is set to the ground potential so that the PMOS transistors MP3 and MP4 are turned on for amplifying the signal voltage. The time from the rising edge of the sense amplifier control signal SA1 to the falling edge of the sense amplifier control signal SA0 is the time sufficient for obtaining a signal voltage of 100 mV, i.e., less than 10 ns is sufficient. This time depends on a design rule of the semiconductor. The smaller the wire width, the shorter is the time.

Accordingly, it is not required to drive the plate line PL1 before the sense amplifier SA works in the present method. In addition, the control of the word lines WL1 and WL2 as well as the control of precharging the bit lines BL1 and BL2 is simplified, so that the access time is shortened.

Furthermore, when the level of the plate line PL1 is fixed to VCC/2 so that the signal voltage is amplified by the sense amplifier SA, rewriting process is performed automatically, so the cycle time is also shortened. In addition, since the level of the cell node can be sustained to VCC/2 during waiting period, refreshing operation is not required.

Figure 12:
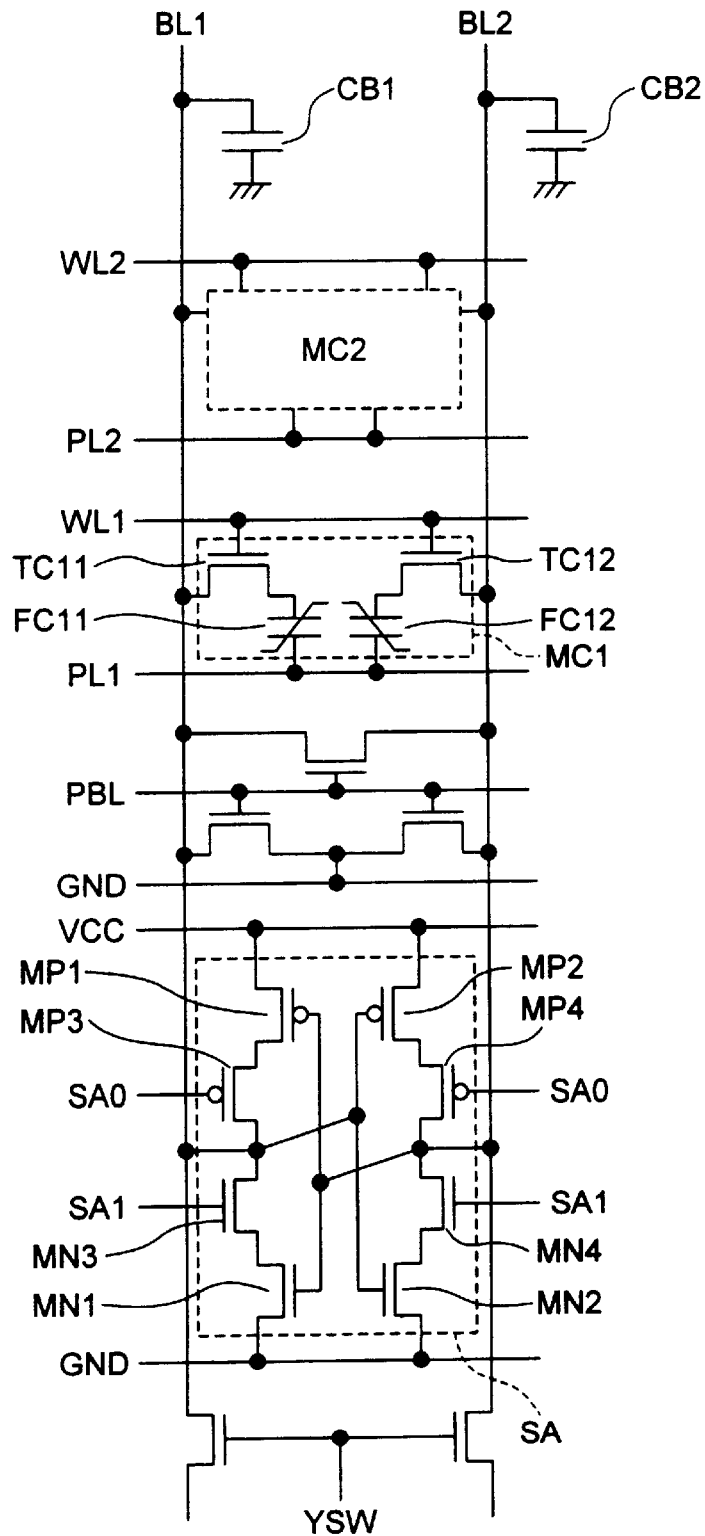
FIG. 12 shows a circuit configuration of the ferroelectric memory device according to a third example of the present invention.

FIG. 12 shows a circuit configuration of the ferroelectric memory device according to a third example of the present invention. In this figure, the ferroelectric memory device according to the third example of the present invention has a configuration similar to that of the ferroelectric memory device according to the second example of the present invention shown in FIG. 10, except that the level VCC/2 in the ferroelectric memory device is replaced with the ground signal GND. The same element is denoted by the same reference. In addition, the operation of the same element is the same as that of the nonvolatile semiconductor memory device according to the second example of the present invention.

Figure 13:
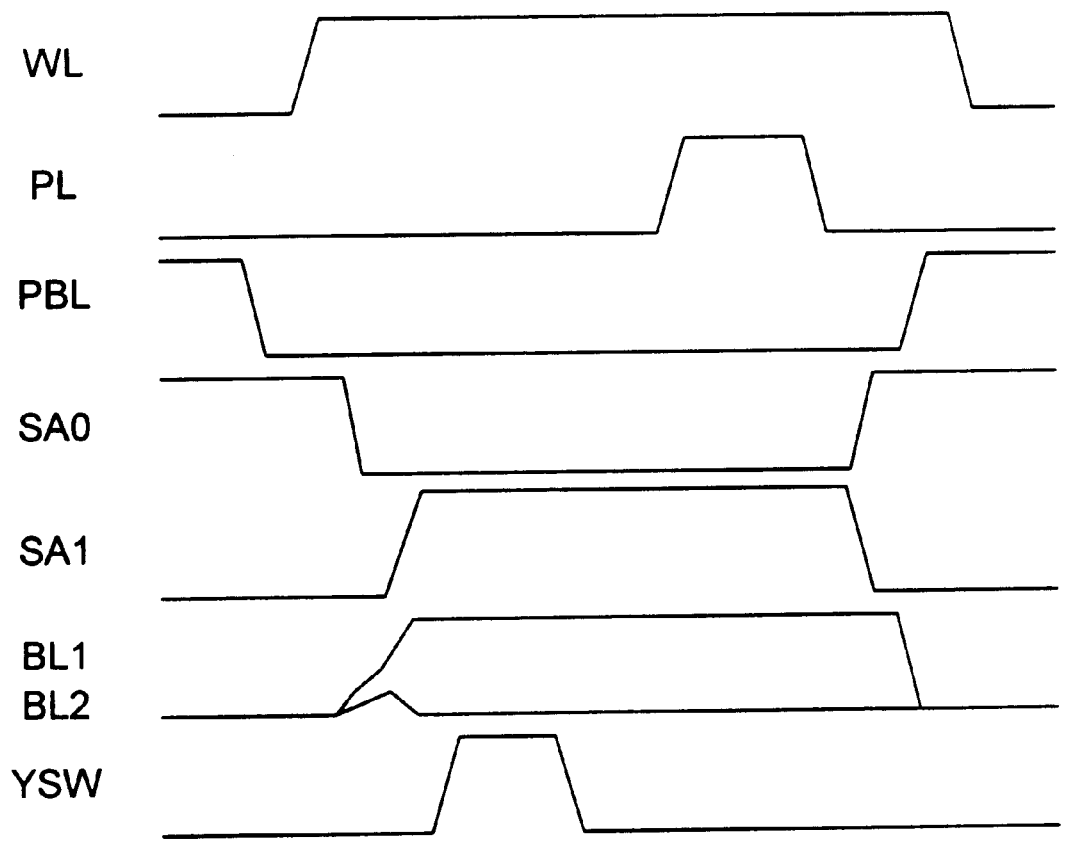
FIG. 13 is a timing chart showing the operation timing of the ferroelectric memory device according to the third example of the present invention.

FIG. 13 is a timing chart showing the operation timing of the ferroelectric memory device according to the third example of the present invention. The read operation of the ferroelectric memory device according to the third example of the present invention will be explained with reference to FIGS. 12 and 13.

During waiting period, bit lines BL1 and BL2 are precharged to the ground potential, and the plate line PL1 is set to the ground potential. After that, the word line WL1 is set to the high potential so as to select the memory cell MC1.

In this state, the GND level is applied to the sense amplifier control signal SA0 so that the sense amplifier SA works and the PMOS transistors MP3 and MP4 become conduction. Since the PMOS transistors MP1, MP2, MP3 and MP4 have the same size, the same current flows into the bit lines BL1 and BL2. Therefore, the flowing charge makes the bit line capacitance and the ferroelectric capacitance charged. Since the ferroelectric capacitors FC11 and FC12 are made of a material having a large relative dielectric constant, the capacitance thereof has a value similar to that of the parasitic capacitance of the bit lines BL1 and BL2.

In addition, the two ferroelectric capacitors of the memory cell MC1 have the different polarization directions. As shown in FIG. 9, one is in the state A, and the other is in the state B, resulting in the different capacitance. Therefore, a detectable signal voltage is generated by the sense amplifier SA on the two bit lines BL1 and BL2 when the PMOS transistors MP3 and MP4 become in conduction. After that, the NMOS transistors MN3 and MN4 are turned on so that the signal voltage is amplified.

Therefore, according to the present method, it is not required to drive the plate line PL1 before the sense amplifier SA works. In addition, since the bit lines BL1, BL2 are not required to be precharged to the level VCC or VCC/2, the access time is shortened and the power consumption can be decreased. Furthermore, during the waiting period, since the bit lines BL1, BL2 and the plate line PL1 are in the ground potential, refreshing operation is not required.

In this case, concerning the operation method of the sense amplifier SA according to the third example of the present invention, timings for turning on NMOS transistors MN1, MN2 and PMOS transistors MP1, MP2 can be different in the same way as the operation method of the sense amplifier SA according to the second example of the present invention, so that the sense amplifier SA can be operated more securely. In this example, the PMOS transistors MP1 and MP2 are activated first, and after generating a signal voltage of approximately 100 mV as an operation margin of the sense amplifier SA, the NMOS transistors MN1 and MN2 are activated. The timing of the sense amplifier control signal SA0, SA1 has sufficient difference of 10 ns or less in the same way as the second example of the present invention.

Figure 14:
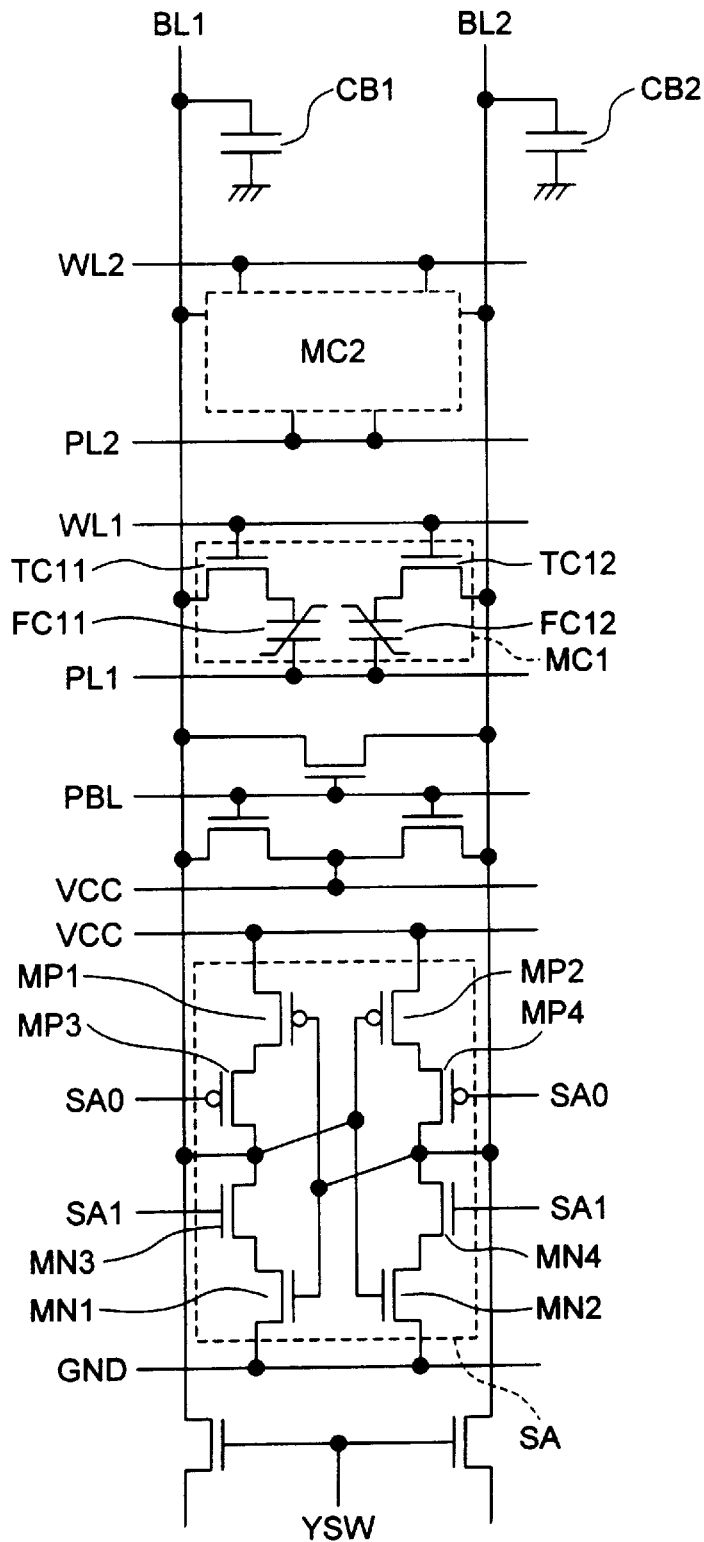
FIG. 14 shows a circuit of the ferroelectric memory device according to a fourth example of the present invention.

FIG. 14 shows a circuit configuration of the ferroelectric memory device according to a fourth example of the present invention. In this figure, the ferroelectric memory device according to the fourth example of the present invention has a circuit configuration similar to that of the nonvolatile semiconductor memory device according to the second example shown in FIG. 10 except that the potential VCC/2 of the ferroelectric memory device according to the second example of the present invention is replaced with the potential VCC. The same element is denoted by the same reference. In addition, the operation of the same element is similar to that of the nonvolatile semiconductor memory device according to the second example of the present invention.

Figure 15:
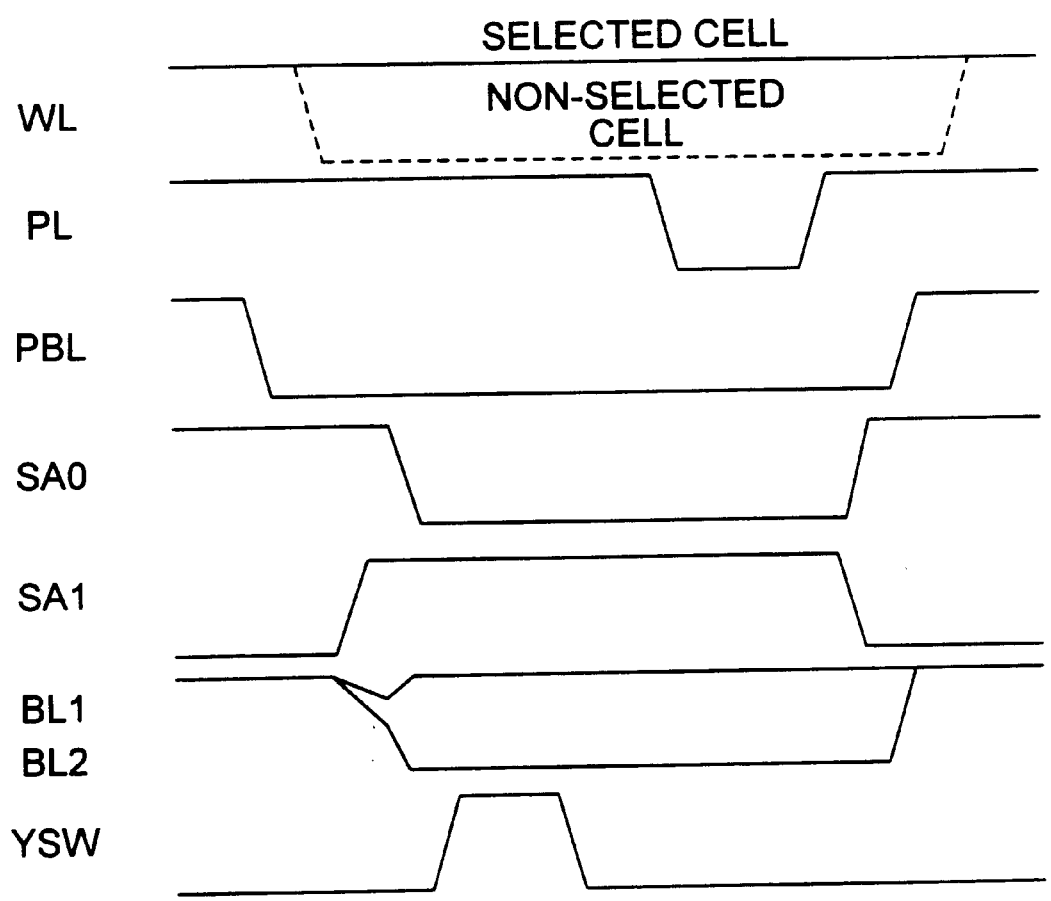
FIG. 15 is a timing chart showing the operation timing of the ferroelectric memory device according to the fourth example of the present invention.

FIG. 15 is a timing chart showing the operation timing of the ferroelectric memory device according to the fourth example of the present invention. The read operation of the ferroelectric memory device according to the fourth example of the present invention will be explained with reference to FIGS. 14 and 15.

During waiting period, bit lines BL1 and BL2 are precharged to the level VCC, the plate line PL1 is set to the level VCC, and the connection node between one terminal of the ferroelectric capacitance and the source terminal of the cell transistor TC11, TC12 is sustained to the level VCC by setting all word lines WL1 and WL2 are set to the high potential level.

After that, all lines except the word line WL1 are set to the ground potential. In this state, the sense amplifier enable signal SA1 is set to the potential VCC so that the NMOS transistors MN3 and MN4 are in conduction and the charge in the bit line capacitance and the ferroelectric capacitance is discharged to the ground potential.

Since the NMOS transistors MN1, MN2, MN3 and MN4 have the same size, the same current flows out of the bit lines BL1 and BL2. In addition, the ferroelectric capacitors FC11 and FC12 have a large size in the same order as the parasitic capacitance of the bit lines BL1 and BL2. The capacitance depends on the polarization direction.

Therefore, a signal voltage that can be detected by the sense amplifier SA is generated on the two bit lines BL1 and BL2. After that, the sense amplifier control signal SA0 makes the PMOS transistors MP3 and MP4 in conduction, so that the signal voltage is amplified.

Therefore, it is not required to drive the plate line PL1 before the sense amplifier SA works in the present method. In addition, the control of the word line WL1 as well as the control of precharging the bit lines BL1 and BL2 is simplified, so that the access time is shortened. Furthermore, since the cell node is sustained to the potential VCC during the waiting period, refreshing operation is not required.

In this case, concerning the operation method of the sense amplifier SA according to the fourth example of the present invention, timings for turning on NMOS transistors MN1, MN2 and PMOS transistors MP1, MP2 can be different in the same way as the operation method of the sense amplifier SA according to the second example of the present invention, so that the sense amplifier SA can be operated more securely. In this example, the NMOS transistors MN1 and MN2 are activated first, and after generating a signal voltage of approximately 100 mV as an operation margin of the sense amplifier SA, the PMOS transistors MP1 and MP2 are activated. The timing of the sense amplifier control signal SA0, SA1 has sufficient difference of 10 ns or less in the same way as the second example of the present invention.

Figure 16:
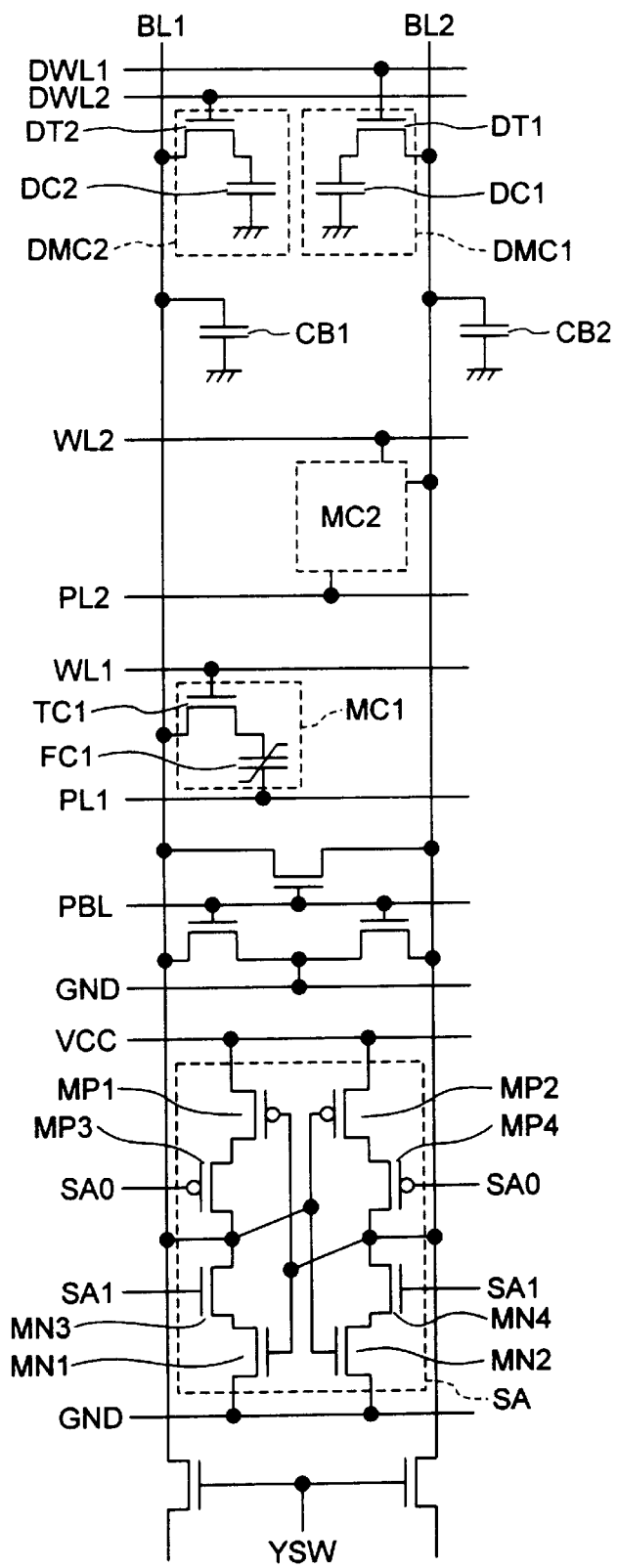
FIG. 16 shows a circuit of the ferroelectric memory device according to a fifth example of the present invention.

The present invention can be applied to the 1T/1C type ferroelectric memory in which a memory cell is made of one ferroelectric capacitor and one MOS transistor. FIG. 16 shows a circuit of the ferroelectric memory device according to a fifth example of the present invention.

The two neighboring bit lines BL1 and BL2 have a parasitic capacitance CB1, CB2, one end of which is connected to a sense amplifier SA that detects data utilizing a differential capacitance between the bit lines BL1 and BL2.

In addition, a memory cell MC1 includes a ferroelectric capacitor FC1 and a cell transistor TC1. One terminal of the ferroelectric capacitor FC1 is connected to the plate line PL1, and the other terminal of the ferroelectric capacitor FC1 is connected to the source terminal of the cell transistor TC1.

In addition, the gate terminal of the cell transistor TC1 is connected to the word line WL1, and the drain terminal of the cell transistor TC1 is connected to the bit line BL1. Furthermore, since the sense amplifier SA is a differential type that utilizes the differential capacitance between the bit lines BL1 and BL2, a reference capacitance, i.e., a medium capacitance between the case where the polarization of the ferroelectric switches and the case where the polarization of the ferroelectric does not switch.

Figure 17:
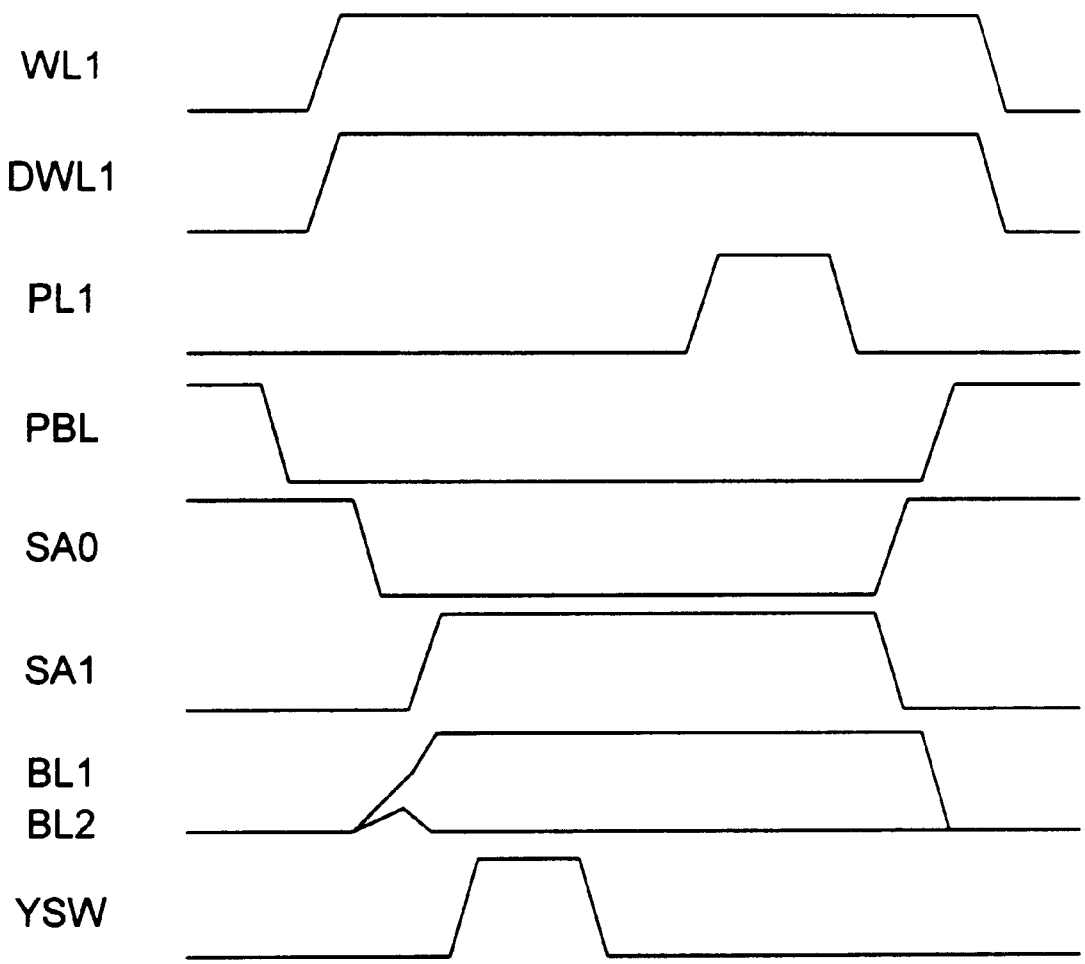
FIG. 17 is a timing chart showing the operation timing of the ferroelectric memory device according to the fifth example of the present invention.

Therefore, the other bit line BL2 making a pair with the bit line BL1 that is connected to the memory cell MC1 is connected to a reference capacitance generating circuit DMC1. In addition, the other memory cell MC2 has the same circuit configuration, and the similar structure and the element size. A plurality of memory cells (not shown) is connected to the bit lines BL1 and BL2. The reference capacitance generating circuits DMC1 and DMC2 include not only the circuit shown in this example but also every reference capacitance generating circuit that can generate a reference capacitance, i.e., a medium capacitance between the case where the polarization of the ferroelectric switches and the case where the polarization of the ferroelectric does not switch. FIG. 17 is a timing chart showing the operation timing of the ferroelectric memory device according to the fifth example of the present invention. The read operation of the ferroelectric memory device according to the fifth example of the present invention will be explained with reference to FIGS. 16 and 17. During waiting period, bit lines BL1 and BL2 are precharged to the ground potential, and the plate line PL1 is set to the ground potential. Then, the word line WL1 is set to the high potential for selecting the memory cell MC1.

In this state, the GND level is applied to the sense amplifier control signal SA0 so that the sense amplifier SA works and the PMOS transistors MP3 and MP4 are in conduction. The reference capacitance generation circuit DMC1 generates a capacitance that is a middle value between the capacitance in the case where the polarization of the ferroelectric capacitance of the memory cell MC1 is in the state A and the capacitance in the state B as shown in FIG. 9.

Therefore, when the PMOS transistors MP3 and MP4 become in conduction, a signal voltage that can be detected by the sense amplifier SA is generated on the two bit lines BL1 and BL2. After that, the sense amplifier control signal SA1 makes the NMOS transistors MN3 and MN4 in conduction so that the signal voltage is amplified.

Therefore, it is not required to drive the plate line PL1 before the sense amplifier SA works in this method. In addition, the bit lines BL1 and BL2 do not need to be precharged to the potential VCC or VCC/2, so that the access time is shortened and the power consumption is decreased. Furthermore, since the bit line BL1, BL2 and the plate line PL1 are in the ground potential during the waiting period, refreshing operation is not required. In addition, since the memory cell MC1 is 1T/1C type, the area of the cell is reduced to the half of the 2T/2C type.

The operation method of the second and fourth examples of the present invention can be realized by the fifth example, and the effect shown in the second and fourth examples of the present invention can be obtained. In addition, since the memory cell MC1 has the 1T/1C structure, the cell area can be reduced by half.

Figure 18:
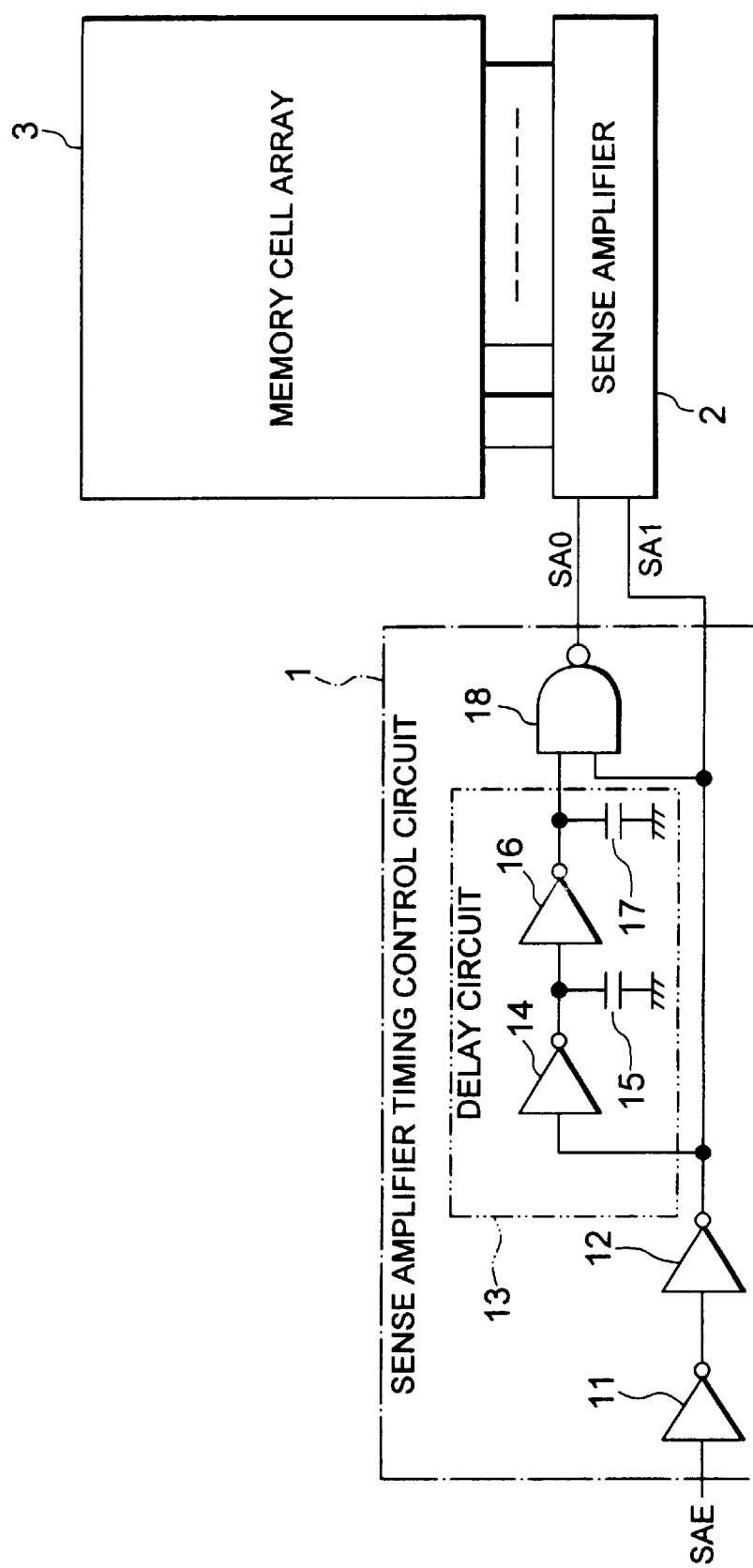
FIG. 18 shows a block diagram showing an example of the sense amplifier timing control circuit used for the present invention.

FIG. 18 shows a block diagram showing an example of the sense amplifier timing control circuit used for the present invention. In the figure, sense amplifier timing control circuit 1 includes inverters 11 and 12, a delay circuit 13, and a NAND circuit 18. The delay circuit 13 includes inverters 14 and 16, capacitors 15 and 17. In this configuration, the sense amplifier timing control circuit 1 inputs the sense amplifier enable signal SAE, and outputs the sense amplifier control signals SA0 and SA1 to the sense amplifier 2. The sense amplifier 2 controls the memory cell array 3.

The sense amplifier control signals SA0 and SA1 are supplied to plural sense amplifiers 2 at the same time. The sense amplifier enable signal SAE is the ground potential when the sense amplifier 2 is non-active state. Therefore, the sense amplifier control signal SA0 becomes the VCC level, and the sense amplifier control signal SA1 becomes the ground potential.

When the sense amplifier enable signal SAE is set to the VCC level so as to activate the sense amplifier 2, the sense amplifier control signal SA1 becomes the VCC level, and the NMOS transistor side of the sense amplifier 2 becomes in conduction to start generating a signal voltage on the bit line.

Since the sense amplifier control signal SA0 is switched to the ground potential after the delay time set by the delay circuit 13 with respect to the sense amplifier control signal SA1, the PMOS side of the sense amplifier 2 becomes in conduction after a sufficient signal voltage is generated on the bit line for amplifying the signal voltage.

In addition, when the sense amplifier enable signal SAE is set to the GND level so as to activate the sense amplifier 2, the NAND circuit 18 neglects the signal delay by the delay circuit 13. Thus, the switch timing of the sense amplifier control signal SA0 to the VCC level and the switch timing of the sense amplifier control signal SA1 to the GND level become the same.

Therefore, the sense amplifier timing control circuit 1 can generate the sense amplifier control signals SA0 and SA1 that are required for the present invention. In addition, the delay time can be set to any value by changing the step number of the delay circuit 13 or by changing the size of the inverters 14 and 16 in the delay circuit 13, or by changing the capacitance values of the capacitors 15 and 17.

Figure 19:
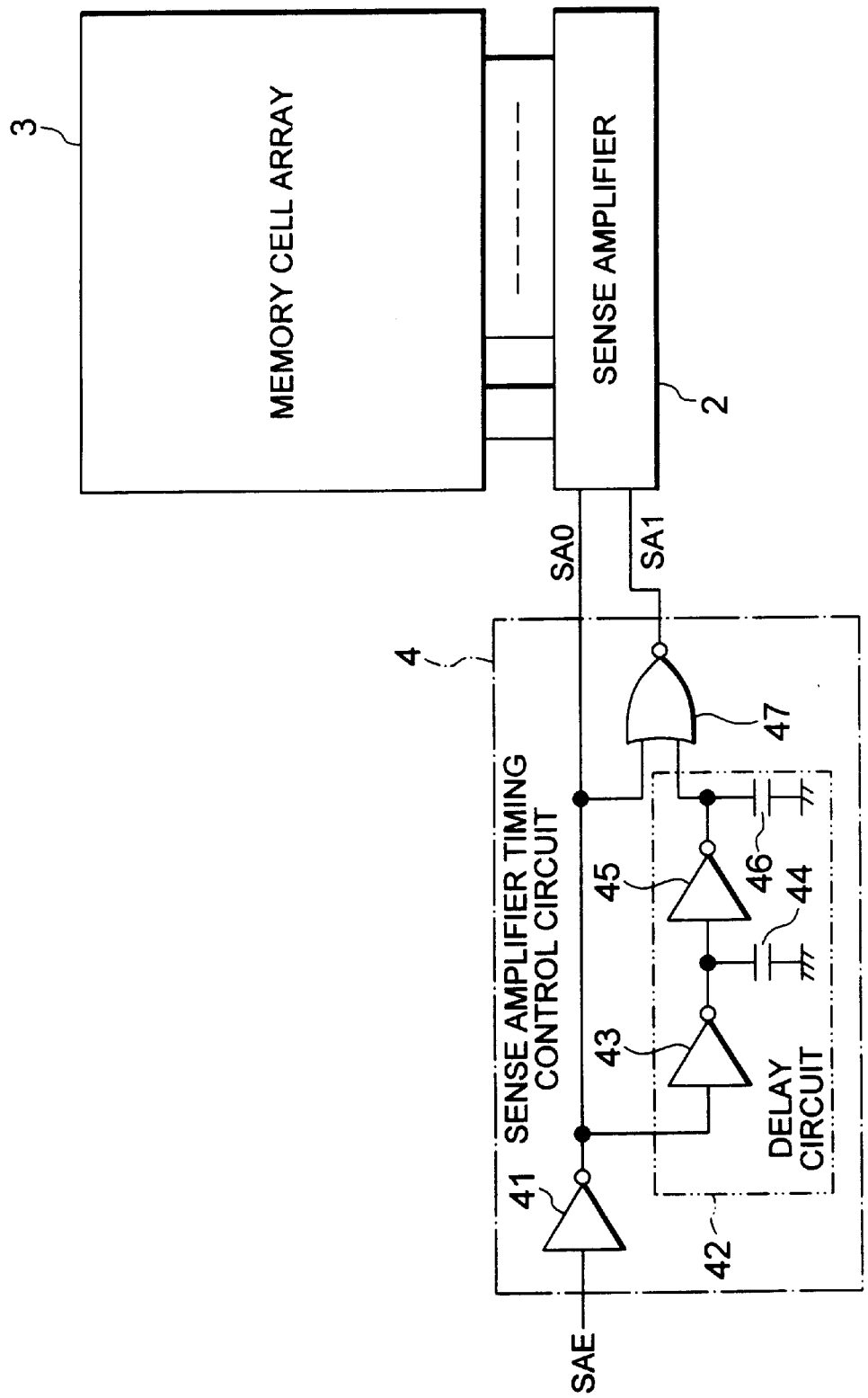
FIG. 19 is a block diagram showing another example of the sense amplifier timing control circuit used for the present invention.

FIG. 19 is a block diagram showing another example of the sense amplifier timing control circuit used for the present invention. In the figure, sense amplifier timing control circuit 4 include an inverter 41, a delay circuit 42, and a NOR circuit 47. The delay circuit 42 includes inverters 43 and 45, capacitors 44 and 46. In this configuration, the sense amplifier timing control circuit 4 inputs the sense amplifier enable signal SAE, and outputs the sense amplifier control signals SA0 and SA1 to the sense amplifier 2. The sense amplifier 2 controls the memory cell array 3.

In the third and the fifth example of the present invention, the sense amplifier control signal SA0 is delayed from the sense amplifier control signal SA1, so the above-mentioned sense amplifier timing control circuit 4 is used. This sense amplifier timing control circuit 4 can realize the operation required to the third and the fifth example of the present invention. In addition, the delay time can be set to any value by changing the step number of the delay circuit 42 or by changing the size of the inverters 43 and 45 in the delay circuit 42, or by changing the capacitance values of the capacitors 44 and 46.

Thus, according to the present invention, reading and writing operation of the memory cells MC1 and MC2 can be realized by a simpler control than the conventional method, so that the operation speed and the power consumption can be substantially improved.

What is claimed is:

1. A sense amplifier circuit connected to two bit lines of a memory cell array including a plurality of member cells disposed in rows and columns for memorizing information, a plurality of bit lines disposed corresponding to the columns of the plurality of memory cells, and a plate line connected to the plurality of memory cells, the sense amplifier circuit comprising a pair of PMOS transistors and a pair of NMOS transistors, which are turned on at different timings, wherein the sense amplifier circuit is activated in the state where the plate line is not driven and the potential levels of the plate line and the bit lines are equal to each other.

2. The sense amplifier circuit according to claim 1, wherein either the pair of PMOS transistors or the pair of NMOS transistors is activated until signal voltage generated on the bit line becomes an operation margin or more of the circuit.

3. A memory device comprising:
   a memory cell array including a plurality of memory cells disposed in rows and columns for memorizing information, a plurality of bit lines disposed corresponding to the columns of the plurality of memory cells, and a plate line connected to the plurality of memory cells; and
   a plurality of differential type sense amplifiers connected to two bit lines, wherein the differential type sense amplifier is activated in the state where the plate line is not driven and the potential levels of the plate line and the bit lines are equal to each other;
   wherein the differential type sense amplifier includes a pair of PMOS transistors and a pair of NMOS transistors, which are turned on at different timings.

4. The memory device according to claim 2, wherein either the pair of PMOS transistors or the pair of NMOS transistors is activated until signal voltage generated on the bit lines and being detectable by the differential type sense amplifier becomes an operation margin or more of the circuit.

5. The memory device according to claim 2, wherein data of the memory cell is read by the differential type sense amplifier that detects a difference capacitance between the two bit lines.

6. The memory device according to claim 5, wherein the potential levels of the bit lines and the plate line are the ground level just before the differential type sense amplifier is activated.

7. The memory device according to claim 5, wherein the potential levels of the bit lines and the plate line are a predetermined level just before the differential type sense amplifier is activated.

8. The memory device according to claim 5, wherein the potential levels of the bit lines and the plate line are a half of a predetermined level just before the differential type sense amplifier is activated.

9. The memory device according to claim 3, wherein each of the plurality of memory cells includes a capacitance element made of a ferroelectric film between two opposing electrodes for memorizing information as a polarization state and a transistor whose source or drain is connected to one of the electrodes of the capacitance element, plurality word lines are connected to gates of transistors of the memory cells on the corresponding row, the plural bit lines are connected to the other of the source and the drain of the transistor, and the plate line is connected to the other of the electrodes of the capacitance element of the plurality of memory cells.

10. A method for reading data out of a memory device comprising a memory cell array including a plurality of memory cells disposed in rows and columns for memorizing information, a plurality of bit lines disposed corresponding to the columns of the plurality of memory cells, and a plate line connected to the plurality of memory cells; and a plurality of differential type sense amplifiers connected to two bit lines, the method comprising:

activating the differential type sense amplifier in the state where the plate line is not driven and the potential levels of the plate line and the bit lines are equal to each other; and turning on the pair of PMOS transistors and the pair of NMOS transistors included in the differential type sense amplifier at different timings.

11. The method according to claim 10, further comprising activating either the pair of PMOS transistors or the pair of NMOS transistors until signal voltage generated on the bit lines becomes an operation margin or more of the circuit.

12. The method according to claim 10, further comprising reading data out of the memory cell by detecting a difference capacitance between the two bit lines by the differential type sense amplifier.

13. The method according to claim 12, wherein the potential levels of the bit lines and the plate line are the ground level just before the differential type sense amplifier is activated.

14. The method according to claim 12, wherein the potential levels of the bit lines and the plate line are a predetermined level just before the differential type sense amplifier is activated.

15. The method according to claim 12, wherein the potential levels of the bit lines and the plate line are a half of a predetermined level just before the differential type sense amplifier is activated.

16. The method according to claim 10, wherein the each of the plurality of memory cells includes a capacitance element made of a ferroelectric film between two opposing electrodes for memorizing information as a polarization state and a transistor whose source or drain is connected to one of the electrodes of the capacitance element, plurality word lines are connected to gates of transistors of the memory cells on the corresponding row, the plural bit lines are connected to the other of the source and the drain of the transistor, and the plate line is connected to the other of the electrodes of the capacitance element of the plurality of memory cells.

* * * * *